United States Patent
Cooley (10) Patent No.: US 11,387,558 B2
(45) Date of Patent: Jul. 12, 2022

(54) LOOP ANTENNA POLARIZATION CONTROL

(71) Applicant: Rockwell Collins, Inc., Cedar Rapids, IA (US)

(72) Inventor: George Cooley, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 216 days.

(21) Appl. No.: 16/723,695

(22) Filed: Dec. 20, 2019

(65) Prior Publication Data

US 2021/0194129 A1    Jun. 24, 2021

(51) Int. Cl.
| | |
|---|---|
| *H01Q 1/36* | (2006.01) |
| *H01Q 15/24* | (2006.01) |
| *H01Q 7/00* | (2006.01) |
| *H04B 17/318* | (2015.01) |
| *H01F 21/12* | (2006.01) |
| *H03H 7/38* | (2006.01) |

(52) U.S. Cl.
CPC .............. *H01Q 7/00* (2013.01); *H01F 21/12* (2013.01); *H01Q 1/36* (2013.01); *H01Q 15/24* (2013.01); *H03H 7/38* (2013.01); *H04B 17/318* (2015.01)

(58) Field of Classification Search
CPC  H01Q 7/00; H01Q 1/36; H01Q 15/24; H01Q 7/06; H01Q 7/005; H04B 17/318; H01F 21/12; H03H 7/38
See application file for complete search history.

(56) References Cited

U.S. PATENT DOCUMENTS

| | | | |
|---|---|---|---|
| 3,775,707 A | * | 11/1973 | Frazier ............... H03H 17/0045 333/32 |
| 4,504,836 A | | 3/1985 | Seavey |
| 6,121,940 A | | 9/2000 | Skahill et al. |
| 6,483,468 B2 | | 11/2002 | Walton |
| 6,784,847 B2 | | 8/2004 | Ngo Bui Hung et al. |
| 7,667,651 B2 | | 2/2010 | McKivergan |

(Continued)

FOREIGN PATENT DOCUMENTS

| | | |
|---|---|---|
| JP | 2001326514 A | 11/2001 |
| WO | 00041268 A1 | 7/2000 |

OTHER PUBLICATIONS

Cebik, W4RNL All-Band Use of Vertical-Plane Deltas, http://www.antentop.org/w4ml.001/vdelt.html Last updated Oct. 13, 1997 (Year: 1997).*

(Continued)

*Primary Examiner* — Hai V Tran
*Assistant Examiner* — Michael M Bouizza
(74) *Attorney, Agent, or Firm* — Suiter Swantz pc llo (57) ABSTRACT

A system and method for adjusting polarization of a loop antenna includes a loop antenna with a high impedance autotransformer. The high impedance autotransformer may be connected to the middle of the horizontal leg of a delta loop or the middle of either horizontal leg of a square loop. The feed-point impedance of the loop antenna may be adjusted between about one hundred ohms and ten thousand ohms. The feed-point impedance is adjusted automatically to maximize signal gain. A neural network may be trained to set the feed-point impedance based on environmental conditions and observed periodicity, with a feedback loop based on actual gain or signal strength.

13 Claims, 9 Drawing Sheets

(56) References Cited

U.S. PATENT DOCUMENTS

| | | | |
|---|---|---|---|
| 9,768,752 | B2 | 9/2017 | du Toit et al. |
| 10,079,587 | B2 | 9/2018 | Ishizuka et al. |
| 2009/0160724 | A1 | 6/2009 | McKivergan |
| 2009/0243767 | A1* | 10/2009 | Rofougaran ......... H04B 5/0093 334/59 |
| 2014/0361942 | A1 | 12/2014 | Parsche et al. |
| 2014/0368404 | A1 | 12/2014 | Li et al. |
| 2015/0295323 | A1 | 10/2015 | Garcia |

OTHER PUBLICATIONS

Extended Search Report for European Application No. 20216130.3 dated May 17, 2021, 31 pages.

* cited by examiner

LOOP ANTENNA POLARIZATION CONTROL

BACKGROUND

As radio waves propagate through the atmosphere, their polarization can be modified, sometimes radically. For example, when radio waves propagate through tropospheric ducting layers, or when they reflect off a near perfect conducting surface, their polarization shifts orthogonally with respect to what was transmitted. During more benign conditions, the radio wave can remain perfectly polarized but in a slightly modified plane. Polarization changes of radio waves that are refracted by the ionosphere are usually more complicated, depending on such factors as the amount of the ionization, frequency and thickness of the refraction layers. Other phenomenon, such as the Faraday Effect, can cause the polarization of a radio wave to rotate.

These phenomena may cause various degrees of channel fading. They also limit the extent to which two orthogonal polarizations can be used at the same frequency and by the same antenna to double the capacity of a radio link using digital waveforms. Techniques that attempt to correct or minimize the deleterious effects of polarization modifications of radio waves propagating through the atmosphere, such as antenna diversity and time delay, all include various drawbacks in terms of cost, complexity, and reliability.

SUMMARY

In one aspect, embodiments of the inventive concepts disclosed herein are directed to a system and method for adjusting polarization of a loop antenna. The loop antenna includes a high impedance autotransformer. The high impedance autotransformer may be connected to the middle of the horizontal leg of a delta loop or the middle of either horizontal leg of a square loop. The feed-point impedance of the loop antenna may be adjusted between about one hundred ohms and ten thousand ohms.

In a further aspect, the feed-point impedance is adjusted automatically to maximize signal gain. A neural network may be trained to set the feed-point impedance based on environmental conditions and observed periodicity, with a feedback loop based on actual gain or signal strength.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and method for adjusting polarization of a loop antenna. The loop antenna includes a high impedance autotransformer. The high impedance autotransformer may be connected to the middle of the horizontal leg of a delta loop or the middle of either horizontal leg of a square loop. The feed-point impedance of the loop antenna may be adjusted between about one hundred ohms and ten thousand ohms.

Figure 1:
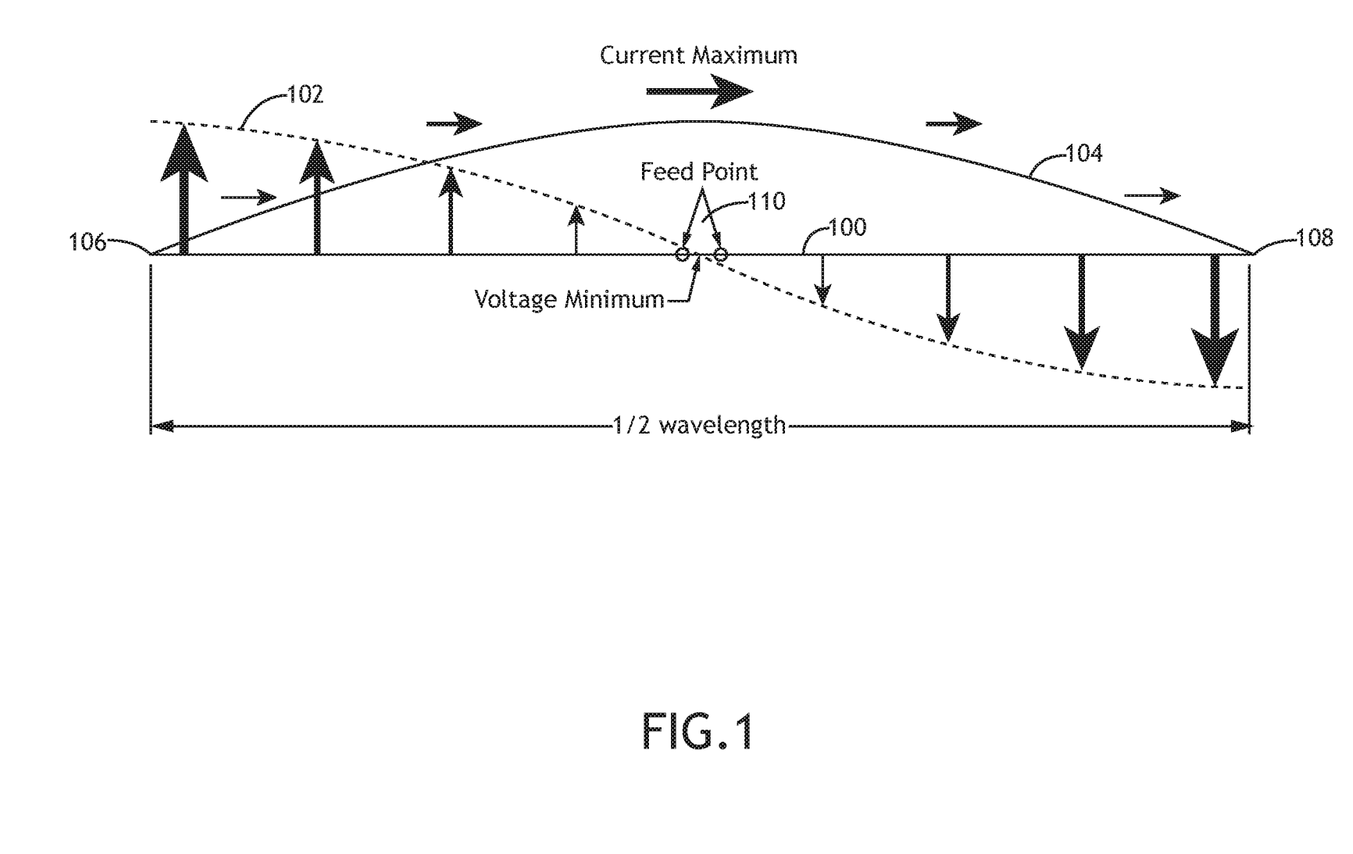
FIG. 1 shows a diagrammatic illustration of the voltage and current conditions of a half-wave dipole.

Referring to FIG. 1, a diagrammatic illustration of the voltage 102 and current 104 conditions of a half-wave dipole 100 is shown. A classic half-wave dipole 100 has boundary conditions at both ends 106, 108, which result in maximum voltages at each end 106, 108 and maximum current in the center. Dipoles may have a feed-point 110 disposed in the center; alternatively, off-center feed-points 110 are also possible. The feed-point impedance of the dipole varies sinusoidally and can be described by:

$$Z_{fd} = Z_o / \sin(360 * x)^2$$

where $Z_o$ is the nominal feed-point impedance in the center of a dipole, which tends to vary with height above the ground and asymptotically approaches 75 ohms as the height of the antenna continues to increase; x is the distance in wavelengths from the end of a dipole; and $Z_{fd}$ is the feed-point impedance of a dipole at distance x from its end. Feed-point impedances on a half-wave dipole 100 with respect to the ends 106, 108 suggests very high values near the ends; between 2K ohm and 5K ohms.

Figure 2A:
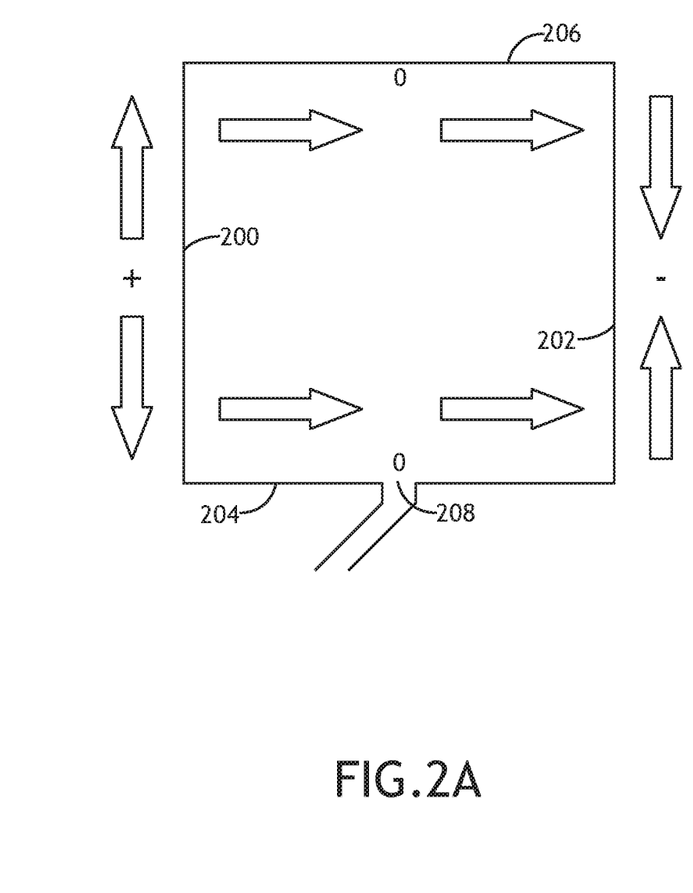
FIG. 2A shows a square loop antenna configured for horizontal polarization.
Figure 2B:
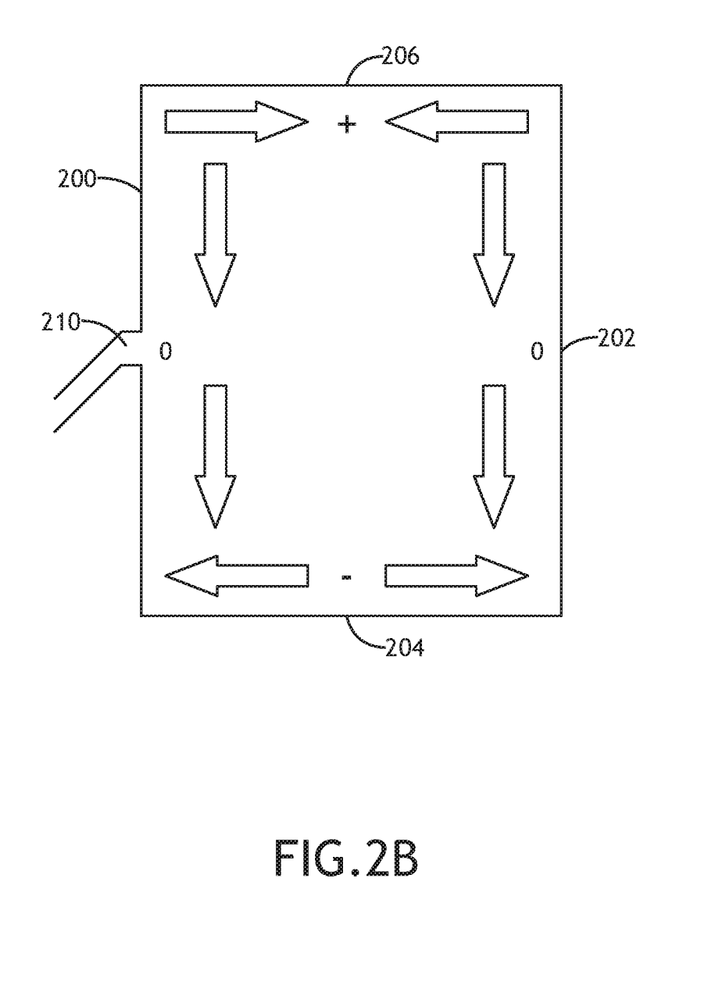
FIG. 2B shows a square loop antenna configured for vertical polarization.

Referring to FIGS. 2A and 2B, a square loop antenna configured for horizontal polarization and vertical polarization respectively are shown. When two half-wave dipoles are connected in series to form a full-wave loop, the feed-point impedance roughly doubles with respect to a half-wave dipole; the higher the antenna from the ground the more closely this approximation holds. As a loop, the current distribution is no longer bounded by the ends, but rather is established by the feed-point impedance and its physical position of the feed-point 208, 210 on the loop. The current distribution of the first half of the loop is mirrored in the second half.

Feeding a square loop in the middle of a horizontal leg 204, 206 with approximately 150 ohms results in horizontal polarization (as in FIG. 2A), while feeding the square loop in the middle of a vertical leg 200, 202 with approximately 150 ohms results in vertical polarization (as in FIG. 2B).

In at least one embodiment, feeding a feed-point 208 in the middle of a horizontal leg 204, 206 with a high-impedance (for example, approximately 5K) results in a current distribution producing a vertical polarization instead of the horizontal polarization that results from feeding the feed-point 208 with approximately 150 feed-point impedance.

Figure 3:
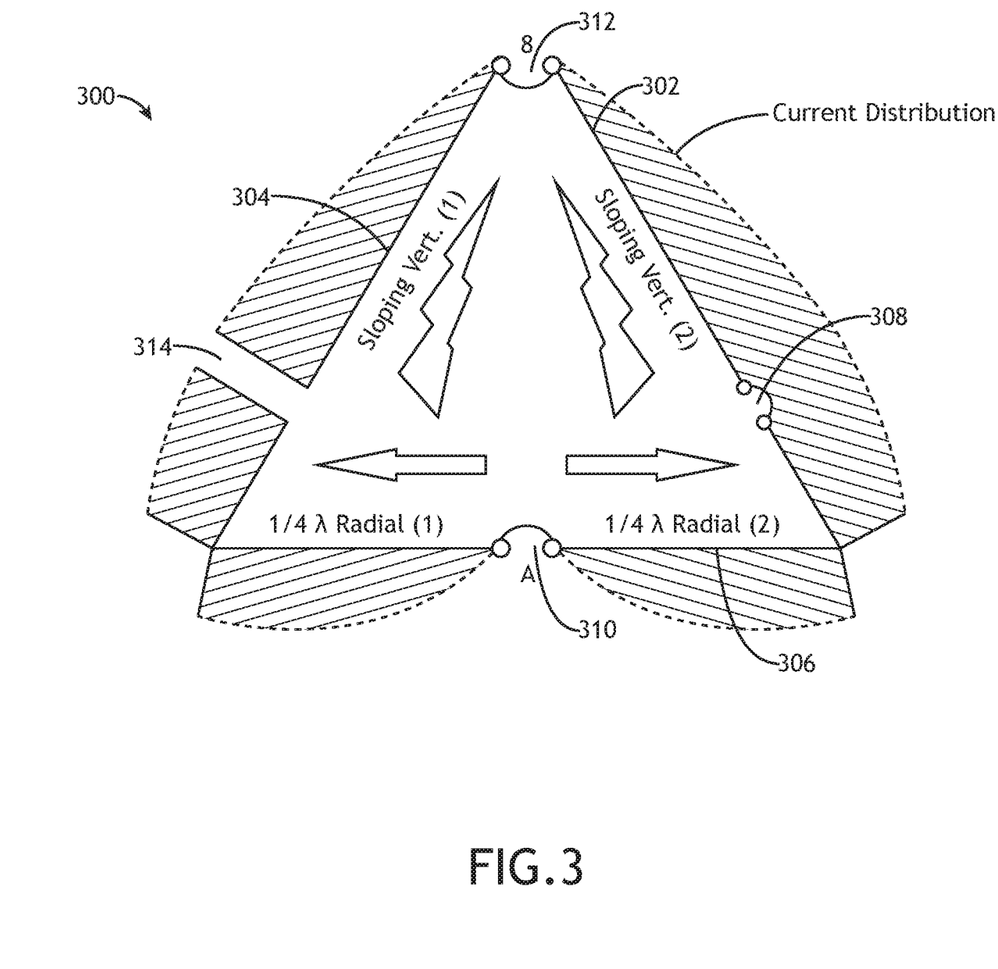
FIG. 3 shows a delta loop antenna configured for adjustable polarization.

Referring to FIG. 3, a delta loop antenna 300 configured for adjustable polarization is shown. The delta loop antenna 300 comprises two vertical legs 302, 304 and a horizontal leg 306; the vertical legs 302, 304 and horizontal leg 306 may define feed-points 308, 310 along their lengths. Feeding a delta loop antenna 300 with approximately 150 ohms at a feed-point 310 in the middle of the horizontal leg 306 results in horizontal polarization while feeding it at a feed-point 308 just above one of the corners, a quarter wave down from the apex 312 results in vertical polarization as shown below.

Figure 4:
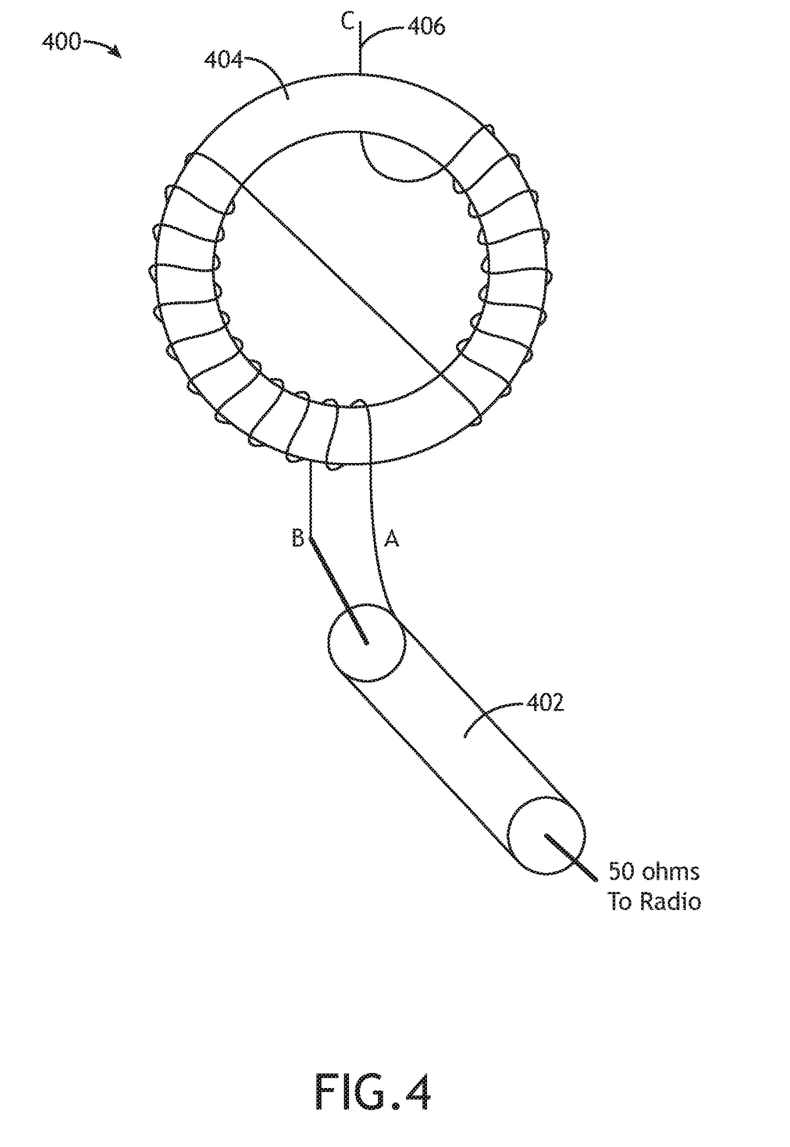
FIG. 4 shows a high impedance autotransformer.

Referring to FIG. 4, a high impedance autotransformer 400 is shown. The autotransformer 400 comprises a source 402 for connecting the autotransformer 400 to a radio, a core element 404, and a connection point 406 to connect the autotransformer 400 to a feed-point of an antenna. In at least one embodiment, the autotransformer 400 may be on the order of 64:1.

In at least one embodiment, the connection point 406 of the high impedance autotransformer 400 is connected to a feed-point of a loop antennal; for example, the feed-point 310 of the horizontal leg 306 shown in FIG. 3 or the feed-point 208 of the horizontal leg 204 shown in FIG. 2A. With a high impedance, current distributions are forced that result in vertical polarization of the corresponding loop antenna. Selecting the feed-point impedance to be either approximately 100 ohms or approximately 10K ohms at the same physical feed-point (208, 210, 308 in FIGS. 2A, 2B, and 3) results in current distributions that produce polarizations that are orthogonal to each other. In at least one embodiment, varying feed-point impedance presented to the loop antenna at the feed-point between approximately 100 ohms or approximately 10K ohms may result in corresponding polarizations that range between horizontal and vertical.

Figure 5:
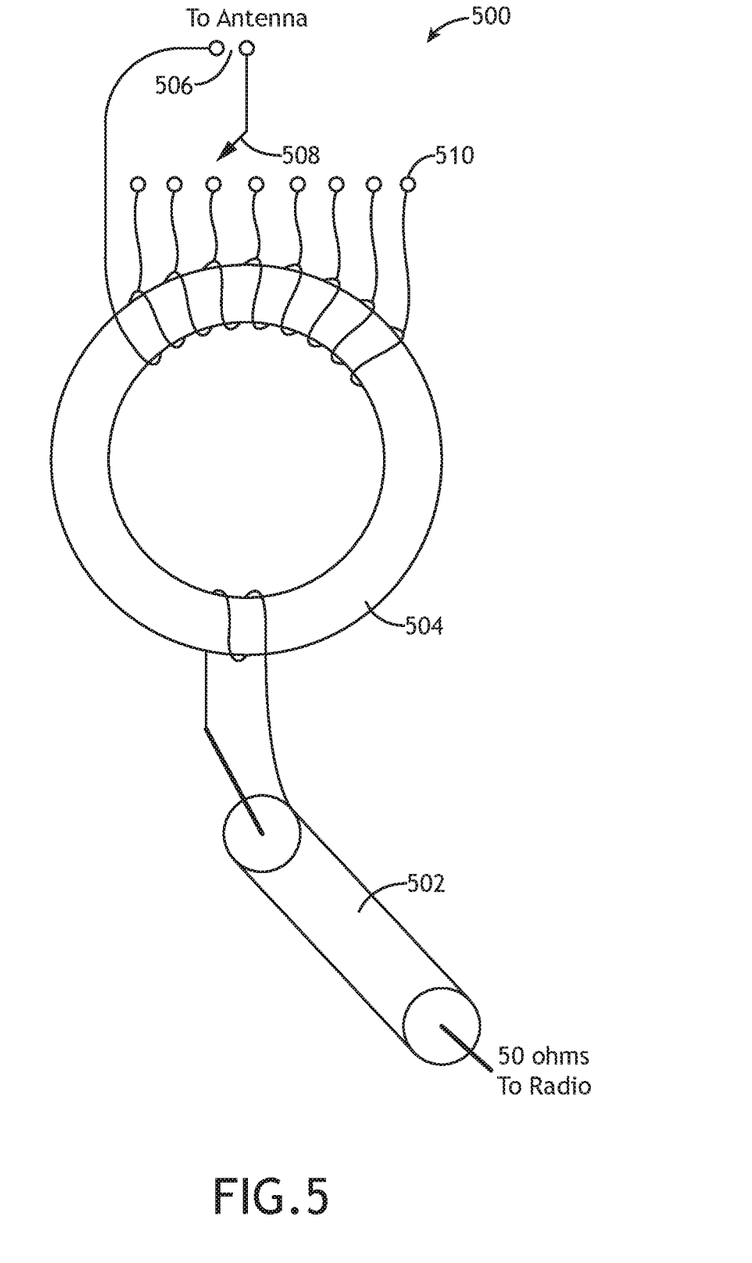
FIG. 5 shows a multi-tap transformer.

Referring to FIG. 5, a multi-tap transformer 500 is shown. The transformer 500 comprises a source 502 for connecting the transformer 500 to a radio, a core element 504, and a connection point 506 to connect the transformer 500 to a feed-point of an antenna. A switch 508 allows the connection point 506 to be connected to various feed-point terminals 510 along the core element 504 to alter the feed-point impedance of the antenna.

In at least one embodiment, a multi-tap transformer 500 with ratios between 2:1 and 200:1 may be used to transform a 50-ohm source 502 that forces a feed-point impedance on a loop antenna to any polarization between vertical and horizontal in real-time. Additional techniques of impedance transformation for establishing the feed-point impedance, as well as tuning out any reactive components, may also be employed.

Figure 6:
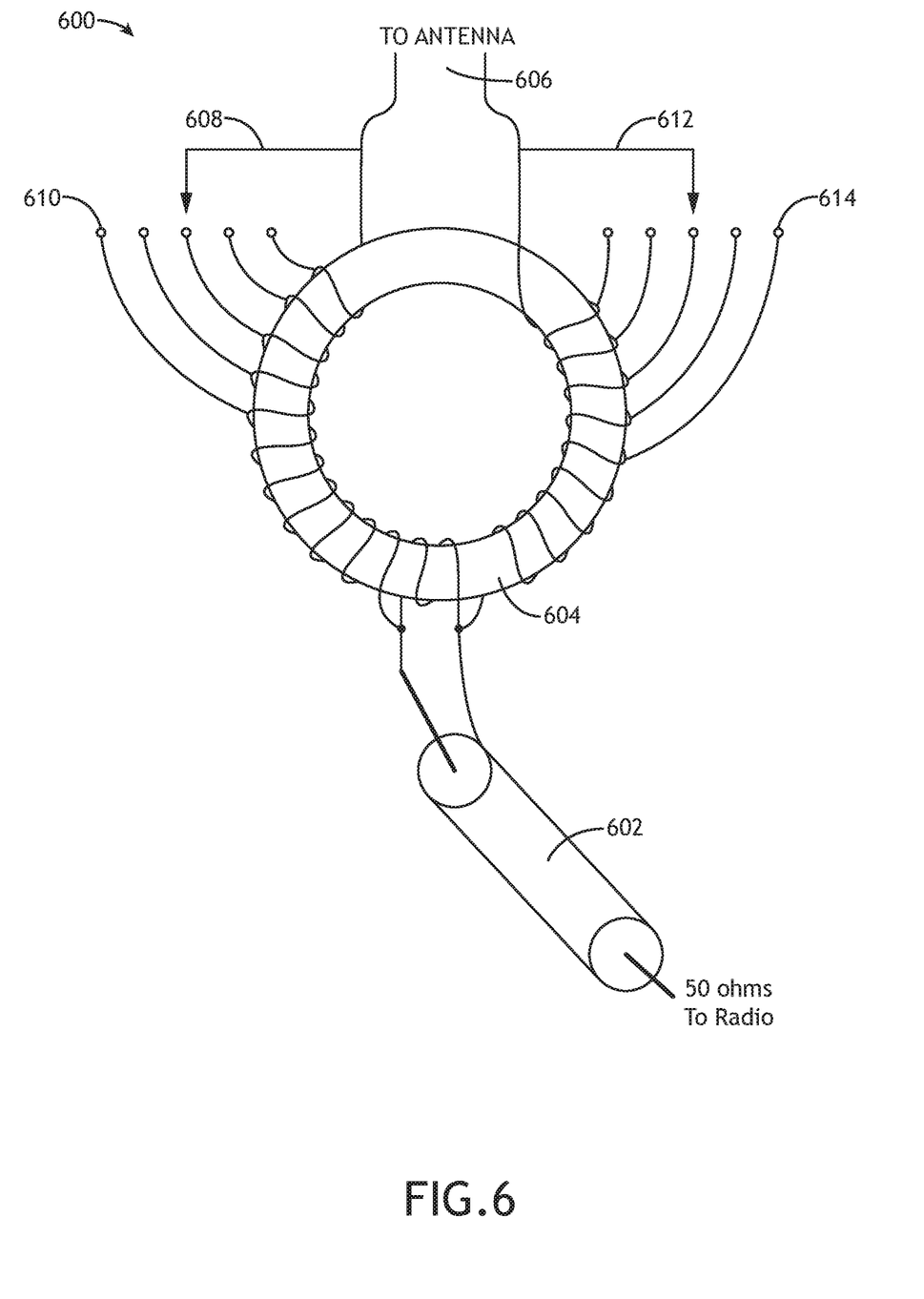
FIG. 6 shows a multi-tap transformer.

Referring to FIG. 6, a multi-tap transformer 600 is shown. The transformer 600 comprises a source 602 for connecting the transformer 600 to a radio, a core element 604, and a connection point 606 to connect the transformer 600 to a feed-point of an antenna. Switches 608, 612 allow the connection point 606 to be connected to various feed-point terminals 610, 614 along the core element 604 to alter the feed-point impedance of the antenna. The total windings connected to the independent sets of feed-point terminals 610, 614 comprise the secondary windings.

In exemplary embodiments, estimates for tap points for both three turn and four turn primary windings based on the $1/\sin^2$ formula for impedance along a half-wave wire are shown below:

| Polarization | Ideal z | Turns per side | Transformer Z |
|---|---|---|---|
| For a three-turn primary | | | |
| 0 | 144 | 1 | 138 |
| 30 | 201 | 2 | 272 |
| 45 | 307 | 3 | 450 |
| 60 | 620 | 4 | 672 |
| 90 | ~5K | 14 | 5.3K |
| For a four-turn primary | | | |
| 0 | 144 | 1 | 112 |
| 30 | 201 | 2 | 200 |
| 45 | 307 | 3 | 312.5 |
| 60 | 620 | 5 | 612 |
| 90 | ~5K | 18 | 5K |

The "turns per side" column represents the number of secondary turns on each side in addition to the primary windings. A three-turn primary will just barely resolve the desired polarization values. A four-turn primary yields a closer approximation.

In at least one embodiment, a multi-tap transformer 600 with ratios between 2:1 and 200:1 may be used to transform a 60-ohm source 602 that forces a feed-point impedance on a loop antenna to any polarization between vertical and horizontal in real-time. Additional techniques of impedance transformation for establishing the feed-point impedance, as well as tuning out any reactive components, may also be employed.

Figure 7:
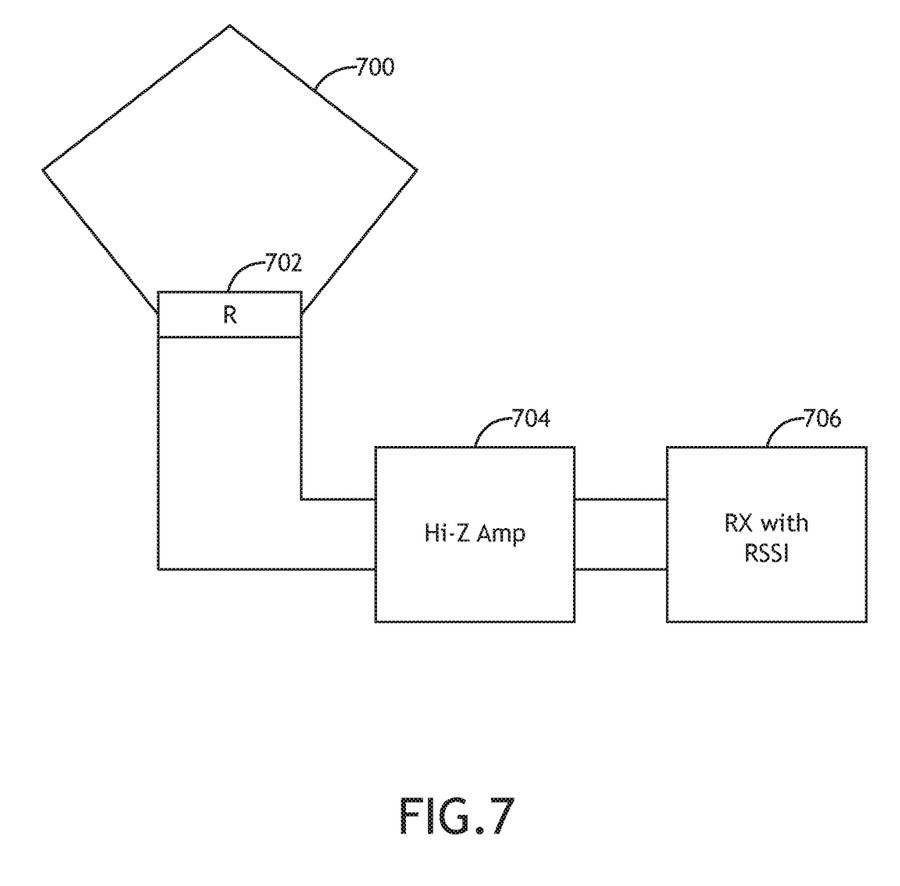
FIG. 7 shows a block diagram of a system for implementing an adjustable polarization loop antenna.

Referring to FIG. 7, a block diagram of a system for implementing an adjustable polarization loop antenna 700 is shown. During a receive phase, the loop antenna 700 is connected, via a variable resistor 702 such as a digital potentiometer, to a high-impedance amplifier 704 such as a field effect transistor and/or op-amp to drive a load such as a typical 50-ohm load used in receivers and transceivers.

During the receive phase, an optimal polarization may be set by changing the variable resistor 702 to maximize the strength of the received signal. Alternatively, or in addition, the signal may be received via a multi-tap transformer. This signal strength can be determined by a number of methods, such as monitoring a received signal strength indicator 706 (RSSI), measuring an automatic gain control voltage, or analyzing audio levels in the detected signal. A power meter or spectrum display can also observe the RSSI when monitoring receiver IF (Intermediate Frequency) amplifiers directly.

Figure 8:
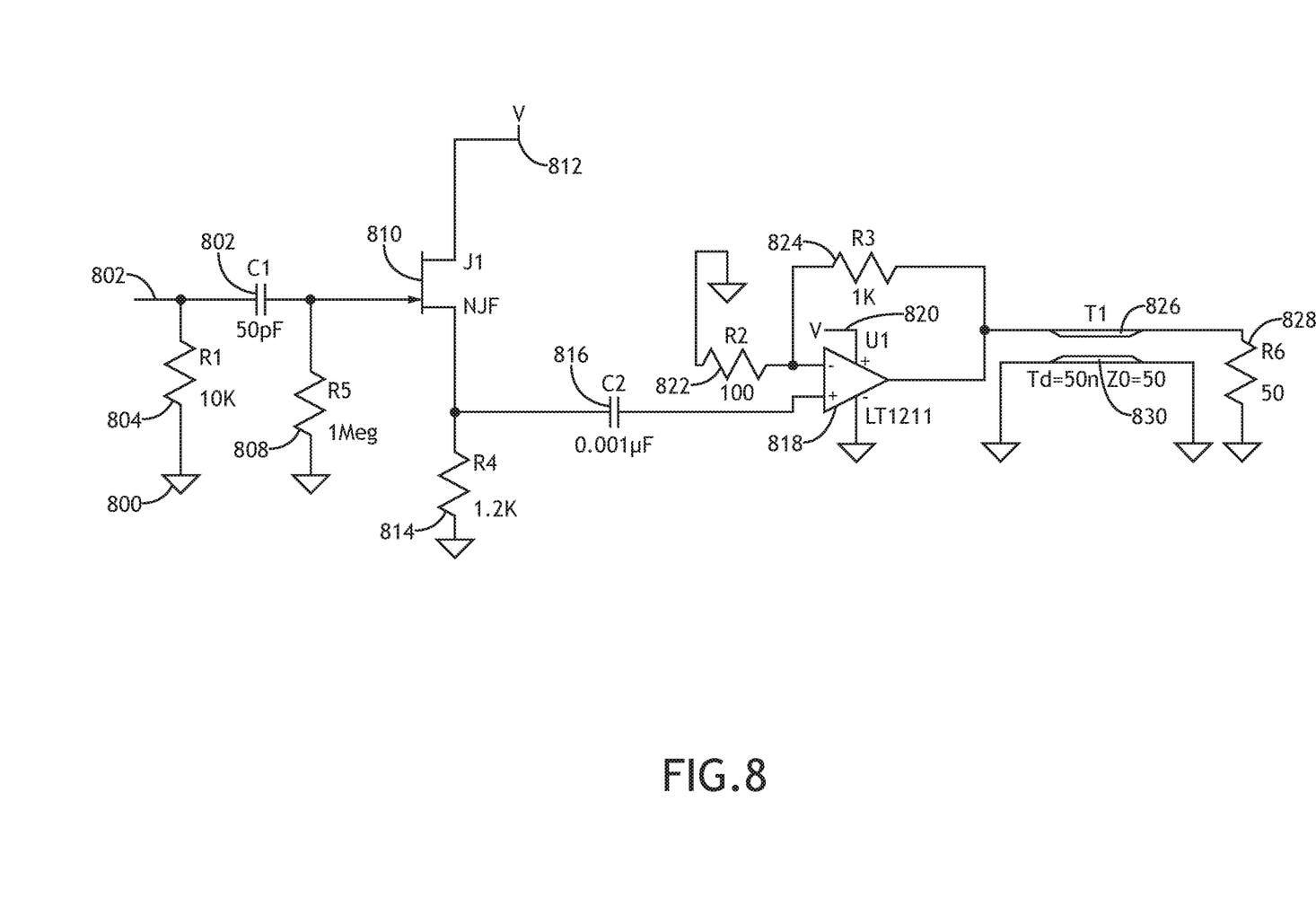
FIG. 8 shows a circuit for adjusting the input impedance of a loop antenna.

Referring to FIG. 8, a circuit for adjusting the input impedance of a loop antenna is shown. The circuit includes a variable resistor 804 connected across feed-point terminals 800, 802 of the loop antenna. One terminal 802 is connected a first capacitor 806 which is connected a first grounded transistor 808 and to the gate of a N-channel junction field effect transistor 810 having a drain connected to a voltage source 812 and a source connected to a second grounded resistor 814. In at least one embodiment, the first grounded resistor 808 represent 1M ohms, the first capacitor represents 50 pico-Farads, and the second grounded resistor 814 represents 1.2K ohms.

A second capacitor 816 is interposed between the source terminal of the transistor 810 and a non-inverting input of an op-amp 818. The inverting input is connected to ground through a third grounded resistor 822 and to the op-amp output through an op-amp resistor 824. The op-amp output drives a transmission line component 826, 830 connected to a receiver resistor 828 (for example, 50 ohms representing a typical receiver). In at least one embodiment, the second capacitor 816 represents 0.001 micro-Farads, the third grounded resistor 822 represents 100 ohms, the op-amp resistor 824 represents 1K ohms, and the op-amp 818 has properties generally corresponding to an LT1211 op-amp. In at least one embodiment, the transmission line component 826, 830 may have attributes of time delay $T_d$=50 ns and characteristic impedance $Z_o$=50.

In may be appreciated that all of the grounded resistors 808, 814, 822 and op-amp resistor 824 may represent inherent circuits properties as opposed to actual physical resistors.

In at least one embodiment, a radio utilizing a system according to the present disclosure continuously varies the polarization of transmitting and/or receiving loop antennas to correct for the polarization modifications during propagation in real time by varying the impedance presented at the loop antenna's feed-point. Polarization can be controlled to any desired value by presenting the appropriate feed-point impedance at a single physical location.

In at least one embodiment, polarization shifts are periodic and the patterns of periodicity may be learned by observing which polarization setting maximizes the signal as a function of time. An artificial intelligence or machine learning algorithm may be used on either the RX or TX antennas to select appropriate polarizations that correct for the polarization distortion on a given channel in real time and adapt to changing conditions.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A radio comprising:
   a loop antenna;
   a transformer connected to a feed-point of the loop antenna; and
   at least one processor connected to the transformer, wherein:
   the transformer is configured to apply a variable feed-point impedance to the feed-point between 50 ohms and 5K ohms;
   applying a first feed-point impedance produces a horizontal polarization to the loop antenna;
   applying a second feed-point impedance produces a vertical polarization to the loop antenna; and
   the at least one processor is configured to:
   determine a signal strength from the loop antenna;
   iteratively apply different feed-point impedances until the signal strength is greater than a defined threshold;
   identify a periodicity of return signal polarization changes; and
   preemptively alter the feed-point impedance to match the polarization of the loop-antenna to the periodic return signal polarization.

2. The radio of claim 1, wherein:
   determining the signal strength comprises continuously monitoring a received signal strength indicator.

3. The radio of claim 1, wherein the transformer comprises a high-impedance autotransformer.

4. The radio of claim 1, wherein the transformer comprises a multi-tap transformer.

5. The radio of claim 1, wherein the loop antenna comprises a square loop antenna having a feed-point disposed substantially in a middle of a horizontal leg.

6. The radio of claim 1, wherein the loop antenna comprises a delta loop antenna having a feed-point disposed substantially in a middle of a horizontal leg.

7. The radio of claim 1, wherein the loop antenna comprises a delta loop antenna having a feed-point disposed substantially in one-quarter of a wavelength below an apex.

8. A loop-antenna comprising:
a feed-point;
a transformer connected to the feed-point and
at least one processor connected to the transformer, wherein:
   the transformer is configured to apply a variable feed-point impedance to the feed-point between 50 ohms and 5K ohms;
   applying a first feed-point impedance produces a horizontal polarization to the loop antenna;
   applying a second feed-point impedance produces a vertical polarization to the loop antenna; and
   the at least one processor is configured to periodically alter the feed-point impedance to match the polarization of the loop-antenna to a periodic return signal polarization.

9. The loop antenna of claim 8, wherein the transformer comprises a high-impedance autotransformer.

10. The loop antenna of claim 8, wherein the transformer comprises a multi-tap transformer.

11. The loop antenna of claim 8, wherein:
the loop antenna comprises a square loop antenna; and
the feed-point is disposed substantially in a middle of a horizontal leg.

12. The loop antenna of claim 8, wherein:
the loop antenna comprises a delta loop antenna; and
the feed-point is disposed substantially in a middle of a horizontal leg.

13. The loop antenna of claim 8, wherein:
the loop antenna comprises a delta loop antenna; and
the feed-point is disposed substantially in one-quarter of a wavelength below an apex.

* * * * *